United States Patent
Kawahara et al.

(10) Patent No.: US 10,134,920 B2
(45) Date of Patent: Nov. 20, 2018

(54) SILICON CARBIDE SEMICONDUCTOR DEVICE

(71) Applicant: Mitsubishi Electric Corporation, Chiyoda-ku (JP)

(72) Inventors: Kotaro Kawahara, Tokyo (JP); Kohei Ebihara, Tokyo (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 15/759,589

(22) PCT Filed: Oct. 4, 2016

(86) PCT No.: PCT/JP2016/079470
§ 371 (c)(1),
(2) Date: Mar. 13, 2018

(87) PCT Pub. No.: WO2017/073264
PCT Pub. Date: May 4, 2017

(65) Prior Publication Data
US 2018/0254354 A1 Sep. 6, 2018

(30) Foreign Application Priority Data
Oct. 30, 2015 (JP) .................... 2015-213707

(51) Int. Cl.
*H01L 29/861* (2006.01)
*H01L 29/868* (2006.01)
(Continued)

(52) U.S. Cl.
CPC ........ *H01L 29/8613* (2013.01); *H01L 21/046* (2013.01); *H01L 21/0475* (2013.01);
(Continued)

(58) Field of Classification Search
CPC ................ H01L 21/0475; H01L 21/06; H01L 21/1608; H01L 21/167; H01L 21/36;
(Continued)

(56) References Cited

U.S. PATENT DOCUMENTS 6,121,633 A * 9/2000 Singh .................. H01L 29/1608
257/212
8,896,084 B2 * 11/2014 Sugawara ........... H01L 29/0615
257/471
(Continued)

FOREIGN PATENT DOCUMENTS

| JP | 2002-185015 A | 6/2002 |
| JP | 2007-165604 A | 6/2007 |

(Continued)

OTHER PUBLICATIONS

International Search Report dated Nov. 22, 2016 in PCT/JP2016/079470, filed on Oct. 4, 2016.

*Primary Examiner* — Allan R Wilson
(74) *Attorney, Agent, or Firm* — Oblon, McClelland, Maier & Neustadt, L.L.P.

(57) ABSTRACT

A mesa type p-n junction diode silicon carbide semiconductor device that includes a first silicon carbide semiconductor substrate, a first drift layer formed on the silicon carbide semiconductor substrate, a second anode layer formed on the drift layer, a mesa structure having a flat mesa bottom portion formed in an outer periphery thereof and having a mesa side wall obliquely formed with respect to a top face of the anode layer in a cross-section ranging from the anode layer to the drift layer, a second lightly doped region formed from an edge of the anode layer to the mesa bottom portion, and a second highly doped region formed on the side of the mesa side wall in the lightly doped region in contact with the edge of the anode layer and in a portion connected to the mesa bottom portion at a lower part of the mesa side wall.

20 Claims, 12 Drawing Sheets

(51) Int. Cl.
  *H01L 29/06* (2006.01)
  *H01L 21/04* (2006.01)
  *H01L 29/16* (2006.01)
  *H01L 29/167* (2006.01)
  *H01L 29/36* (2006.01)
  *H01L 29/66* (2006.01)

(52) U.S. Cl.
  CPC ............ *H01L 29/06* (2013.01); *H01L 29/167* (2013.01); *H01L 29/1608* (2013.01); *H01L 29/36* (2013.01); *H01L 29/6606* (2013.01); *H01L 29/861* (2013.01); *H01L 29/868* (2013.01)

(58) Field of Classification Search
  CPC ............... H01L 21/6606; H01L 21/861; H01L 21/8613; H01L 21/868
  See application file for complete search history.

(56) References Cited

U.S. PATENT DOCUMENTS

| | | | |
|---|---|---|---|
| 9,853,125 B2* | 12/2017 | Chuang | H01L 29/66356 |
| 2007/0090370 A1* | 4/2007 | Nakayama | H01L 29/045 257/77 |
| 2007/0170436 A1* | 7/2007 | Sugawara | H01L 29/0615 257/77 |
| 2007/0200115 A1* | 8/2007 | Das | H01L 29/1608 257/77 |
| 2009/0045413 A1 | 2/2009 | Ishii et al. | |
| 2012/0313212 A1* | 12/2012 | Sugawara | H01L 29/0615 257/471 |
| 2013/0130482 A1 | 5/2013 | Masuda et al. | |
| 2013/0214291 A1 | 8/2013 | Uchida et al. | |
| 2015/0115284 A1* | 4/2015 | Arthur | H01L 21/0465 257/77 |
| 2015/0270128 A1 | 9/2015 | Nishio et al. | |

FOREIGN PATENT DOCUMENTS

| | | |
|---|---|---|
| JP | 2009-10120 A | 1/2009 |
| JP | 2010-45363 A | 2/2010 |
| JP | 2012-195519 A | 10/2012 |
| JP | 2013-038308 A | 2/2013 |
| JP | 2013-110243 A | 6/2013 |
| JP | 2013-120784 A | 6/2013 |
| JP | 5249532 B2 * | 7/2013 |
| JP | 2014-041920 A | 3/2014 |
| JP | 2015-179781 A | 10/2015 |
| JP | 2016-92168 A | 5/2016 |
| WO | 2012/056705 A1 | 5/2012 |

* cited by examiner

SILICON CARBIDE SEMICONDUCTOR DEVICE

TECHNICAL FIELD

The present invention relates to a silicon carbide semiconductor device, especially to a silicon carbide p-n junction diode semiconductor device which is used as a power semiconductor device.

BACKGROUND ART

In recent years, much attention is paid to a silicon carbide semiconductor device using silicon carbide (SiC) as a next-generation semiconductor device which can achieve high breakdown voltage and low power loss. When compared with silicon (Si) which has been used in a conventional semiconductor device, SiC is about ten times higher than Si in dielectric breakdown electric field strength. Therefore, a silicon carbide semiconductor device is expected to be applied particularly to a power semiconductor device which requires high breakdown voltage.

There exists a p-n junction diode as one of power semiconductor devices with high breakdown voltage. In a conventional SiC p-n junction diode, a mesa structure is formed at an anode portion for element isolation and relaxation of electric field concentration at the anode end (for example, Patent Document 1). Further, there is a conventional SiC p-n junction diode whose mesa structure is formed not vertically but obliquely (for example, Patent Document 2). Also, it is known that, by forming a P-type electric field relaxation layer at a mesa peripheral portion, a depletion layer is formed at the p-n junction between an N-type layer and the electric field relaxation layer in the silicon carbide semiconductor, and that an electric field in an off-state of the silicon carbide semiconductor device, namely, in a static state where constant voltage is applied, is suppressed (for example, Patent Document 2).

PRIOR ART DOCUMENTS

Patent Document

Patent Document 1: Japanese Patent Laid-Open Publication No. 2007-165604
Patent Document 2: Japanese Patent Laid-Open Publication No. 2009-10120

SUMMARY OF THE INVENTION

Problems to be Solved by the Invention

However, when a vertical mesa structure is formed at the anode portion as shown in Patent Document 1, the electric field is concentrated at the mesa end. As shown in Patent Document 2, by forming the mesa structure in an oblique shape, not in a vertical shape, the electric field can be dispersed not only at the mesa end but also at the anode edge. However, the inventors found that, with the structure disclosed in Patent Document 2, the electric field is concentrated at the mesa end and at the anode edge during switching operation, which may lead to an element failure. The reason why the electric field is concentrated at the mesa end and the anode edge during switching operation is thought to be as follows.

As described above, in the off-state of the silicon carbide semiconductor device, namely in the static state in which constant voltage is applied, because the voltage is kept by the depletion layer formed by the introduction of the electric field relaxation layer, a high electric field will not be applied to the anode edge and the mesa end. In the switching state, however, in which the silicon carbide semiconductor device is switched from the on-state to the off-state, sweeping-out of electric charges from the depletion layer region is delayed since high voltage is applied at high speed. Thus in some cases, an edge of the depletion layer may reach the anode edge and the mesa end, so that the electric field may become concentrated at the anode edge and the mesa end. In particular, in silicon carbide semiconductor devices, because an acceptor level is deeper than in a conventional silicon semiconductor and the number of deeper levels is larger than the silicon, the sweeping-out of electric charges during switching operation is delayed, and thus many cases where relaxation of the electric field is not sufficient exist.

In order to suppress the electric field even during the switching operation described above, there may be a counter measure for suppressing the expansion of the depletion layer by increasing P-type impurity amount in the electric field relaxation layer. However, if the P-type impurity amount in the electric field relaxation layer is optimized in consideration of the electric field relaxation during the switching operation, the electric field in the static off-state may be increased, and this may lead to deterioration in the breakdown voltage. Thus, in a conventional silicon carbide semiconductor device, it has been difficult to achieve the electric field relaxation both in the static off-state and in the dynamic switching state, so that it has been difficult to sufficiently improve the breakdown voltage of the device.

The present invention is devised to solve the above-described problems and to provide a silicon carbide semiconductor device which can suppress the electric field during the switching operation while suppressing the electric field concentration in the off-state so as to enhance the breakdown voltage of the device.

Means for Solving the Problems

A silicon carbide semiconductor device according to the present invention includes a first conductivity-type silicon carbide semiconductor substrate, a first conductivity-type drift layer formed on the silicon carbide semiconductor substrate, a second conductivity-type anode layer formed on the drift layer, a mesa structure having a flat mesa bottom portion formed in an outer periphery thereof and having a mesa side wall being obliquely formed with respect to a top face of the anode layer in a cross section ranging from the anode layer to the drift layer, a second conductivity-type lightly doped region formed from an edge of the anode layer to the mesa bottom portion so as to include the mesa side wall and formed so as for a cross section of an interface thereof with the drift layer to be oblique to the top face of the anode layer, and a second conductivity-type highly doped region being in contact with the anode layer and formed in a portion on the side of the mesa side wall in the lightly doped region being in contact with the edge of the anode layer and in a portion connected to the mesa bottom portion at a lower part of the mesa side wall, the highly doped region whose second conductive-type impurity concentration is higher than that of the lightly doped region.

Effects of the Invention

In a silicon carbide semiconductor device according to the present invention, the electric field in the static off-state is suppressed by providing a lightly doped region, and the electric field concentration during the high-speed switching operation can be suppressed by providing the second conductivity-type highly doped region at least below the anode edge as well as at the mesa end, so that a highly reliable silicon carbide semiconductor device can be obtained.

EMBODIMENTS FOR CARRYING OUT THE INVENTION

Embodiment 1

First, a configuration of a silicon carbide semiconductor device according to Embodiment 1 of the present invention will be described.

Figure 1:
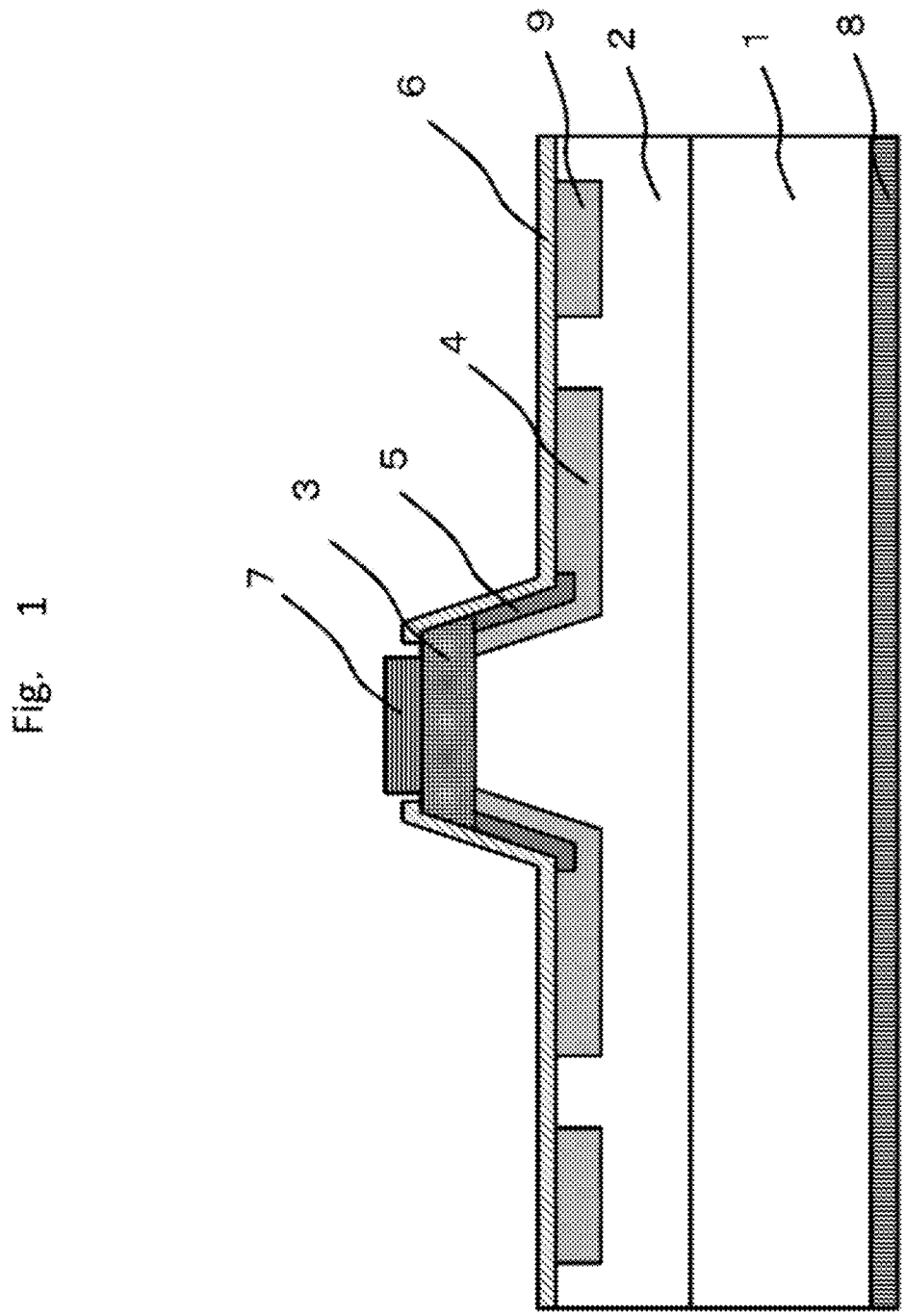
FIG. 1 is a schematic cross-sectional diagram of a p-n junction diode according to Embodiment 1 of the present invention.

FIG. 1 is a schematic cross-sectional diagram showing a configuration of a p-n junction diode which is a silicon carbide semiconductor device according to Embodiment 1. As shown in FIG. 1, the p-n junction diode according to the present embodiment has a configuration in which an N-type drift layer 2 made of silicon carbide is formed on a first main face of a low resistance N-type silicon carbide semiconductor substrate 1. A P-type anode layer 3 is formed on the drift layer 2. The p-n junction diode in the present embodiment being a mesa type has a mesa structure with a trapezoidal cross section in which a side wall thereof is formed by obliquely cutting off the anode layer 3 down to the drift layer 2.

From the side wall in the cross-section oblique to the top face of the anode layer 3 (called mesa side wall) to a flat portion after the cut-off (called mesa bottom portion), a P-type lightly doped region 4 is formed to be connected to the anode layer 3 with a predetermined width from the edge of the anode layer 3 on the top face side of the drift layer 2 to the mesa bottom portion so as to be in contact with and to include the mesa side wall. On the side of the mesa side wall in the lightly doped region 4, a P-type highly doped region 5 is formed from the edge of the anode layer 3 to the mesa bottom portion. An anode electrode 7 is formed on the top face of the anode layer 3 and a cathode electrode 8 is formed on the bottom face of the silicon carbide semiconductor substrate 1. Also, an outer lightly doped region 9 is formed on the outer peripheral side of the lightly doped region 4 in the mesa bottom portion. An insulating layer 6 is formed on the mesa side wall of the anode layer 3 and the drift layer 2 where the lightly doped region 4 and the highly doped region 5 are formed, and on the top face of the mesa bottom portion. The insulating layer 6 is also formed around the anode electrode 7 on the top face of the anode layer 3.

The mesa side wall is oblique to the mesa bottom face and the top face of the anode layer 3. From the viewpoint of electric field relaxation, it may be sufficient that the angle thereof is, for example, from 10 to 80 degrees. The shape of the mesa structure may be either linear or curved in the cross section. Also, the interface between the lightly doped region 4 and the drift layer 2 is oblique to the mesa bottom portion and the top face of the anode layer 3. The angle thereof is, for example, from 10 to 80 degrees.

Next, a manufacturing method of the p-n junction diode which is a silicon carbide semiconductor device according to this embodiment of the present invention will be described by using FIGS. 2 to 7. FIGS. 2 to 7 are schematic cross-sectional diagrams of the p-n junction diode in each step to describe the manufacturing method of the p-n junction diode which is a silicon carbide semiconductor device according to the present embodiment.

Figure 2:
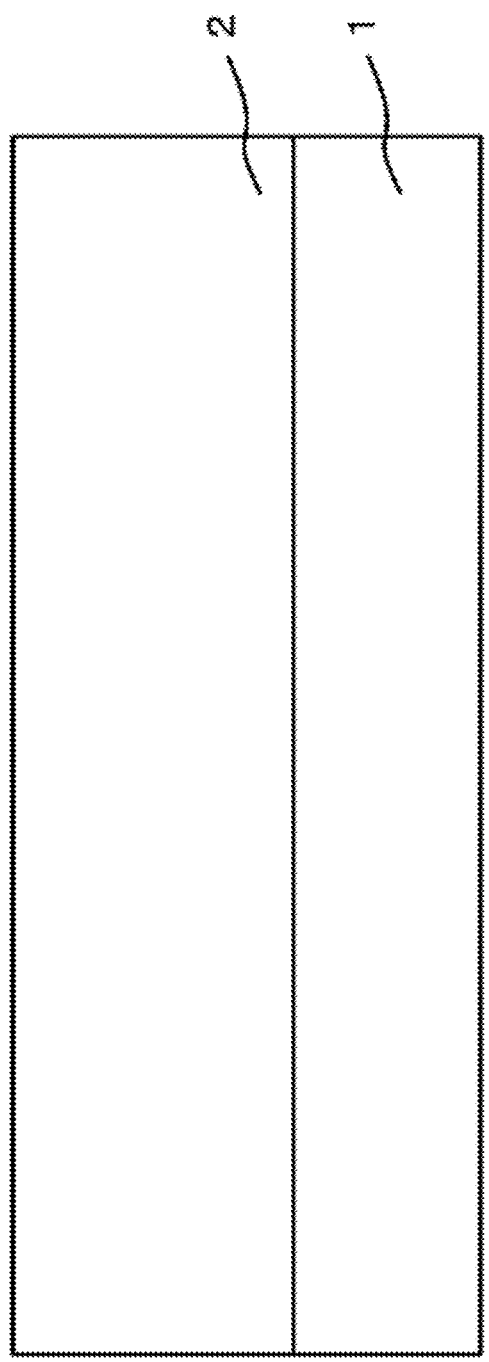
FIG. 2 is a schematic cross-sectional diagram of the p-n junction diode for explanation of a manufacturing method, according to Embodiment 1 of the present invention.

First, as shown in FIG. 2, the drift layer 2 is formed on the silicon carbide semiconductor substrate 1. An N-type (first conductivity-type) low resistance silicon carbide semiconductor substrate 1 of the 4H poly-type is prepared. The drift layer 2, which is an N-type (first conductivity-type) silicon carbide epitaxial layer doped with nitrogen (N) by a chemical vapor deposition (CVD) method, is epitaxially grown on the substrate. It may be sufficient that, for example, impurity concentration of the drift layer 2 is from $1 \times 10^{14}$ cm$^{-3}$ to $1 \times 10^{18}$ cm$^{-3}$ and the thickness is from 1 to 200 μm, which can be properly chosen in accordance with the designed breakdown voltage for the silicon carbide semiconductor device.

Figure 3:
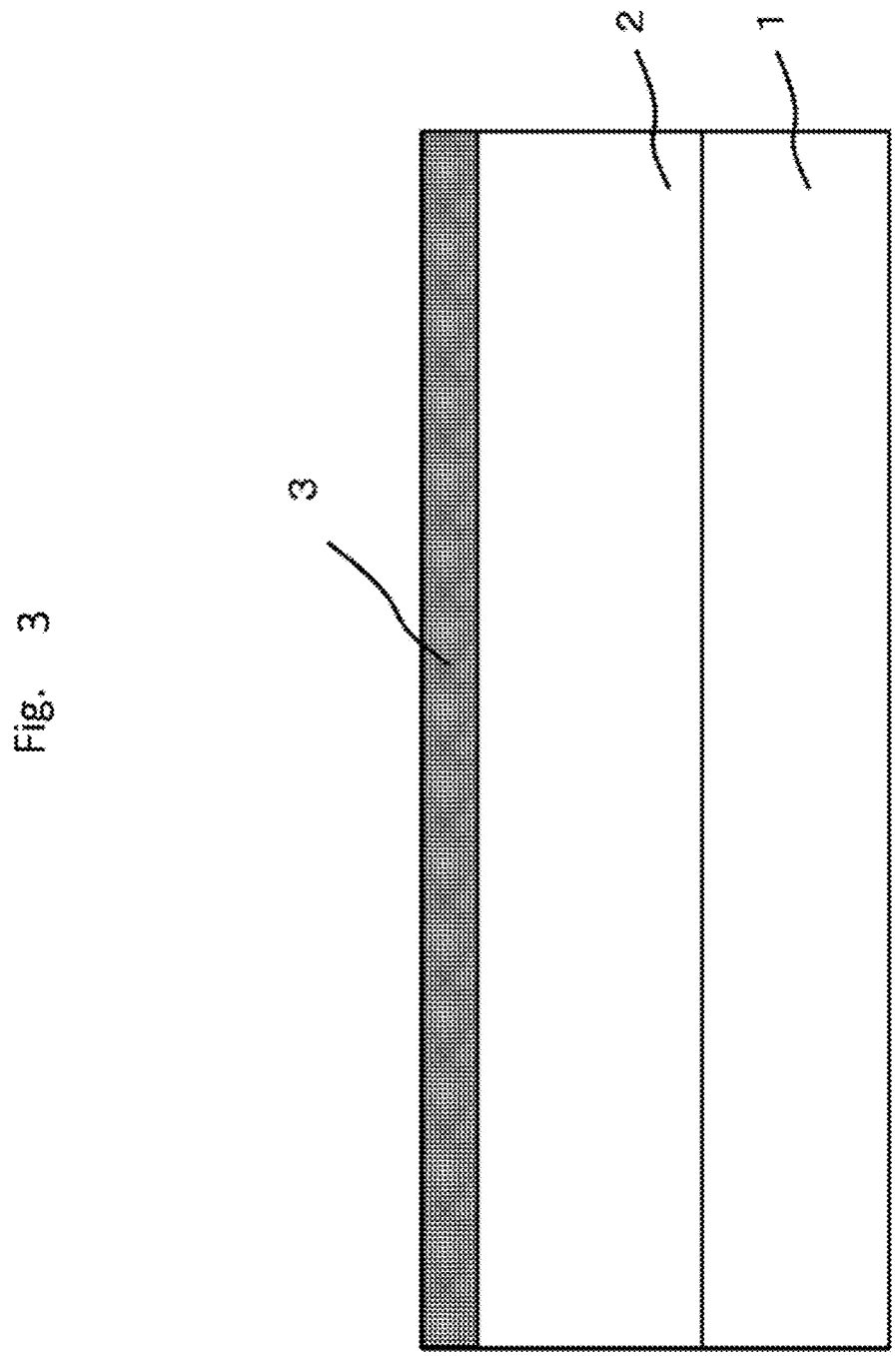
FIG. 3 is a schematic cross-sectional diagram of the p-n junction diode for explanation of a manufacturing method, according to Embodiment 1 of the present invention.

Next, as shown in FIG. 3, the P-type anode layer 3 is formed through ion implantation of P-type impurities on the top face of the drift layer 2. The ion to be implanted is, for example, aluminum (Al), and the depth of the implantation is about 0.1 to 3 μm, which is less than the thickness of the drift layer 2. Also, the impurity concentration of the ion-implanted Al is within the range from $1 \times 10^{18}$ to $1 \times 10^{21}$ cm$^{-3}$, which is higher than the N-type impurity concentration of the drift layer 2. Note that, the anode layer 3 may be formed by epitaxially growing a P-type SiC layer on the drift layer 2.

Next, a silicon oxide film is formed on the anode layer 3, for example, by a chemical vapor deposition (CVD) method and, after patterning the silicon oxide film to a predetermined shape by photolithography, the mesa shape is formed by etching using the silicon oxide film as an etching mask.

Figure 4:
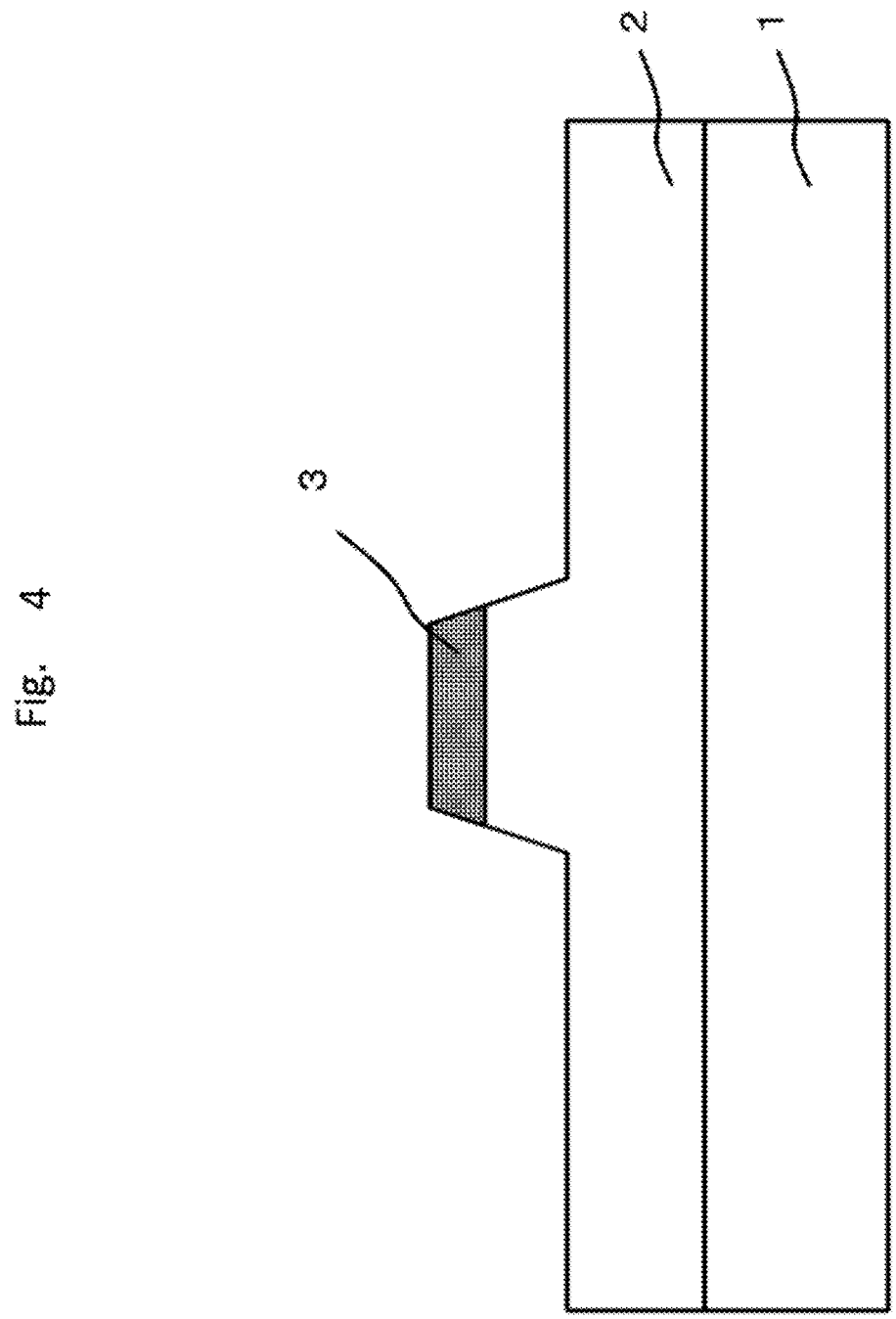
FIG. 4 is a schematic cross-sectional diagram of the p-n junction diode for explanation of a manufacturing method, according to Embodiment 1 of the present invention.

Here, the end face of the silicon oxide film is made into an oblique shape by isotropic etching, using hydrofluoric acid or the like. Then, reactive ion etching (RIE) is performed using the silicon oxide film with this oblique end face as a mask, and thus the mesa structure with an oblique shape can be formed as shown in FIG. 4. The height of the mesa, namely the length in the depth direction from the top face of the anode layer 3 to the mesa bottom portion, may be, for example, within the range from 1 μm to 10 μm.

Figure 5:
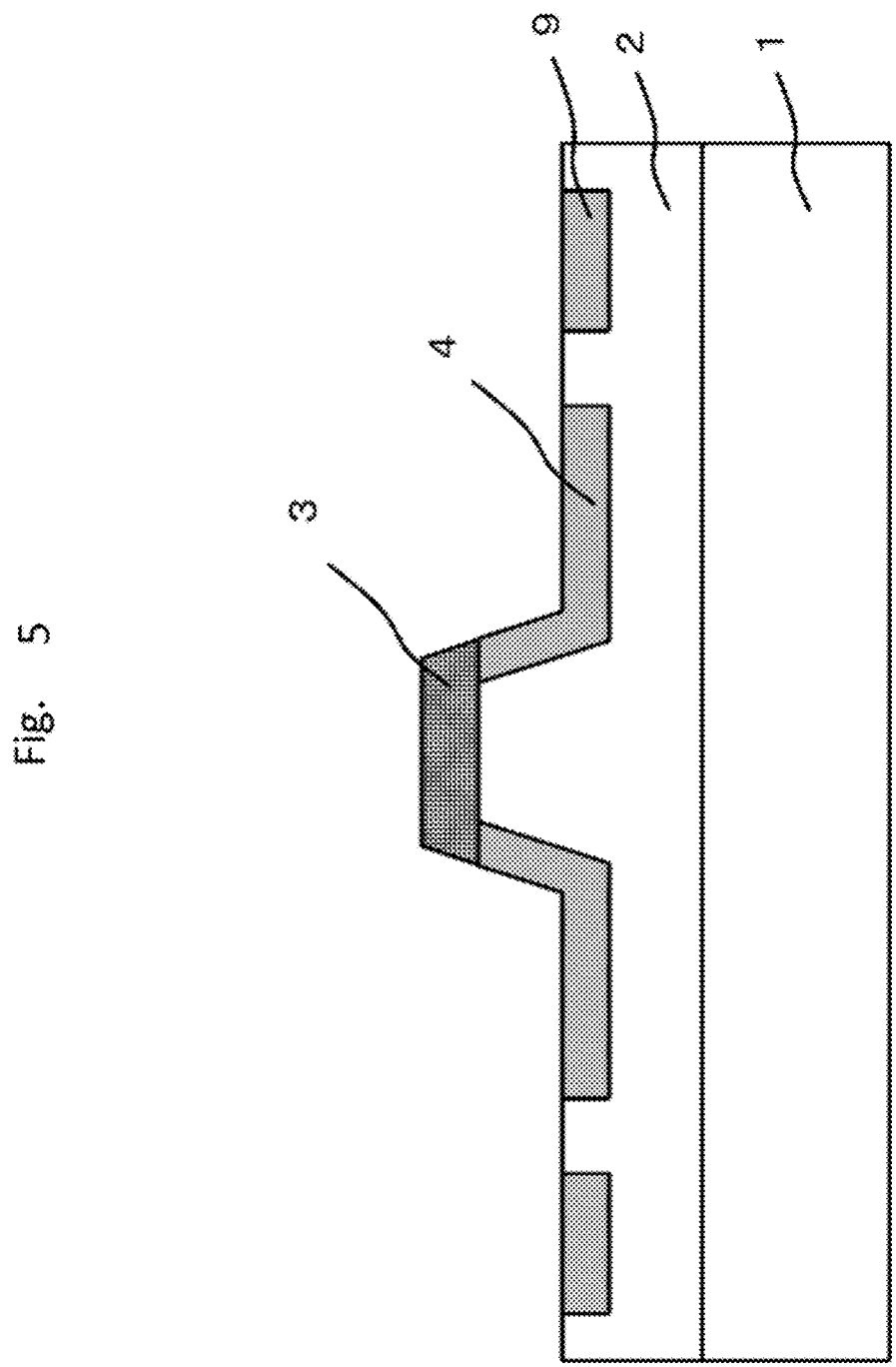
FIG. 5 is a schematic cross-sectional diagram of the p-n junction diode for explanation of a manufacturing method, according to Embodiment 1 of the present invention.
Figure 6:
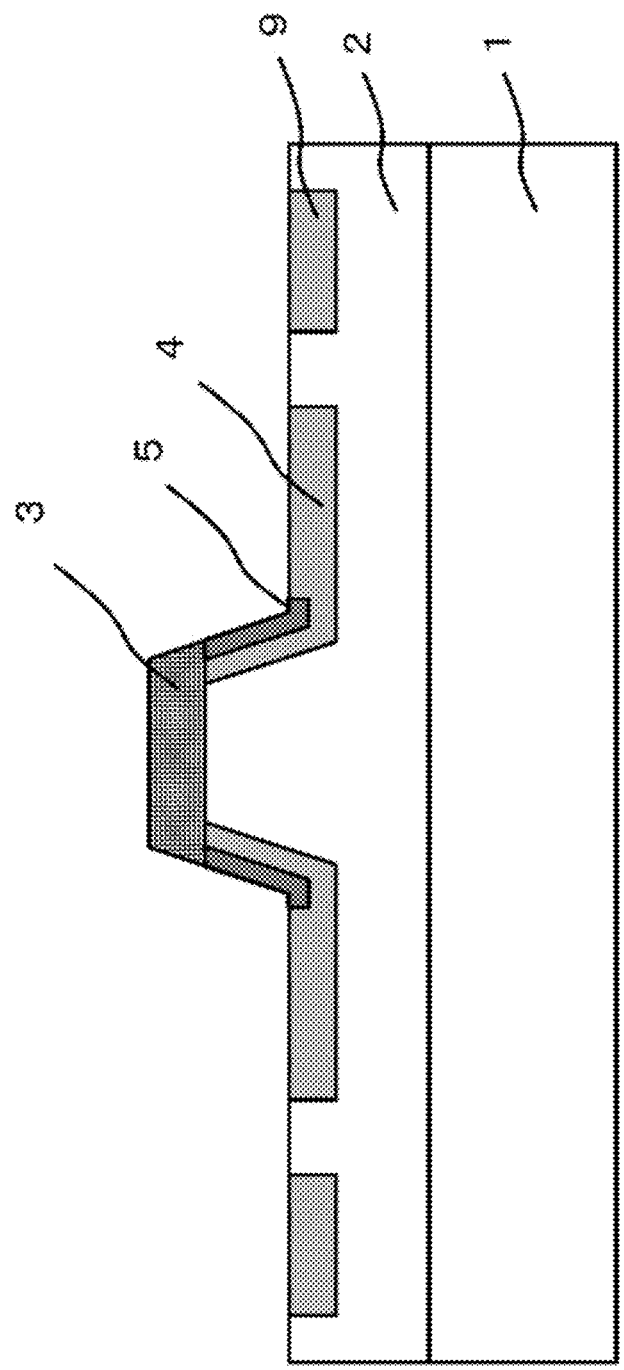
FIG. 6 is a schematic cross-sectional diagram of the p-n junction diode for explanation of a manufacturing method, according to Embodiment 1 of the present invention.

Next, the lightly doped region 4 is formed in the region of the drift layer 2, as shown in FIG. 5, by implanting P-type impurity ions with a predetermined width and in a predetermined position from the mesa side wall being in contact with the edge of the anode layer 3 to the mesa bottom portion. Further, the highly doped region 5 is formed, as shown in FIG. 6, by implanting the P-type impurity ions to the obliquely-shaped portion of the mesa structure from the edge of the anode layer 3 to the mesa bottom portion. At the same time when forming the lightly doped region 4, the outer lightly doped region 9 may be formed in the surface portion of the mesa bottom portion in the outside of the lightly doped region 4.

The impurity concentrations of the lightly doped region 4 and the highly doped region 5 may be, for example, within the range from $1 \times 10^{17}$ to $1 \times 10^{19}$ $cm^{-3}$ and within the range from $1.0 \times 10^{18}/cm^3$ to $1.0 \times 10^{21}/cm^3$, respectively. The impurity concentration of the highly doped region 5 needs to be twice or more than twice that of the lightly doped region 4, and more preferably, to be higher than that of the lightly doped region 4 by one or more orders of magnitude. Also, it is preferable that the impurity concentration of the highly doped region 5 is lower than the impurity concentration of the anode layer 3.

Figure 7:
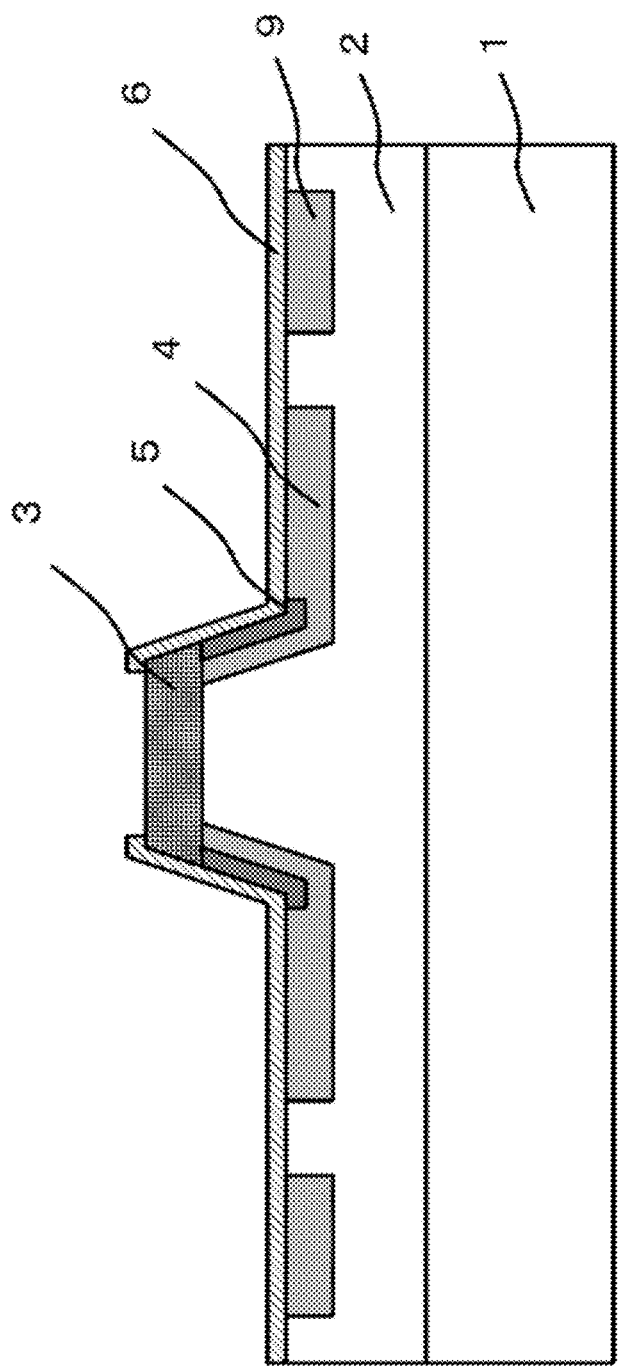
FIG. 7 is a schematic cross-sectional diagram of the p-n junction diode for explanation of a manufacturing method, according to Embodiment 1 of the present invention.

The anode layer 3, the lightly doped region 4, and the highly doped region 5, which are formed by ion implantation, are activated after the ion implantation through thermal processing that is performed in an inactive gas atmosphere at a temperature ranging from 1300 to 2000° C. for a period ranging from ten seconds to one hour. Next, the insulating layer 6 made of silicon oxide or the like is formed, through CVD method or the like, on the entire top face of the substrate to which the anode layer 3 and other regions are already formed. Then, as shown in FIG. 7, an opening is formed on the anode layer 3. Next, by a sputtering method or the like, the cathode electrode 8 is formed on the silicon carbide semiconductor substrate 1 so as to be in contact with its back side opposite to its face where the anode layer 3 and other layers are formed, thereby forming an ohmic contact with the silicon carbide semiconductor substrate 1. Next, the anode electrode 7 made of nickel or the like is formed on the anode layer 3 in a predetermined portion of the top face thereof, thereby forming an ohmic contact with the anode layer 3. As for a method to pattern the anode electrode 7 into a desired shape, for example, first a metal film is formed on a patterned resist mask by a sputtering method or the like, and then, the resist mask and the metal film right above the mask are removed by using a lift-off method.

In this way shown above, the p-n junction diode shown in FIG. 1, which is a silicon carbide semiconductor device according to Embodiment 1 of the present invention, can be manufactured.

Next, operation of an SiC p-n junction diode, which is a silicon carbide semiconductor device according to Embodiment 1 of the present invention, will be described. In the SiC p-n junction diode according to the present embodiment, when a negative voltage with respect to the anode electrode 7 is applied to the cathode electrode 8, a current flows from the anode electrode 7 to the cathode electrode 8, and the p-n junction diode turns to be conductive (on-state). In contrast, when a positive voltage with respect to the anode electrode 7 is applied to the cathode electrode 8, the current is blocked by the p-n junction between the anode layer 3 and the drift layer 2, and the p-n junction diode turns to be non-conductive (off-state).

Figure 8:
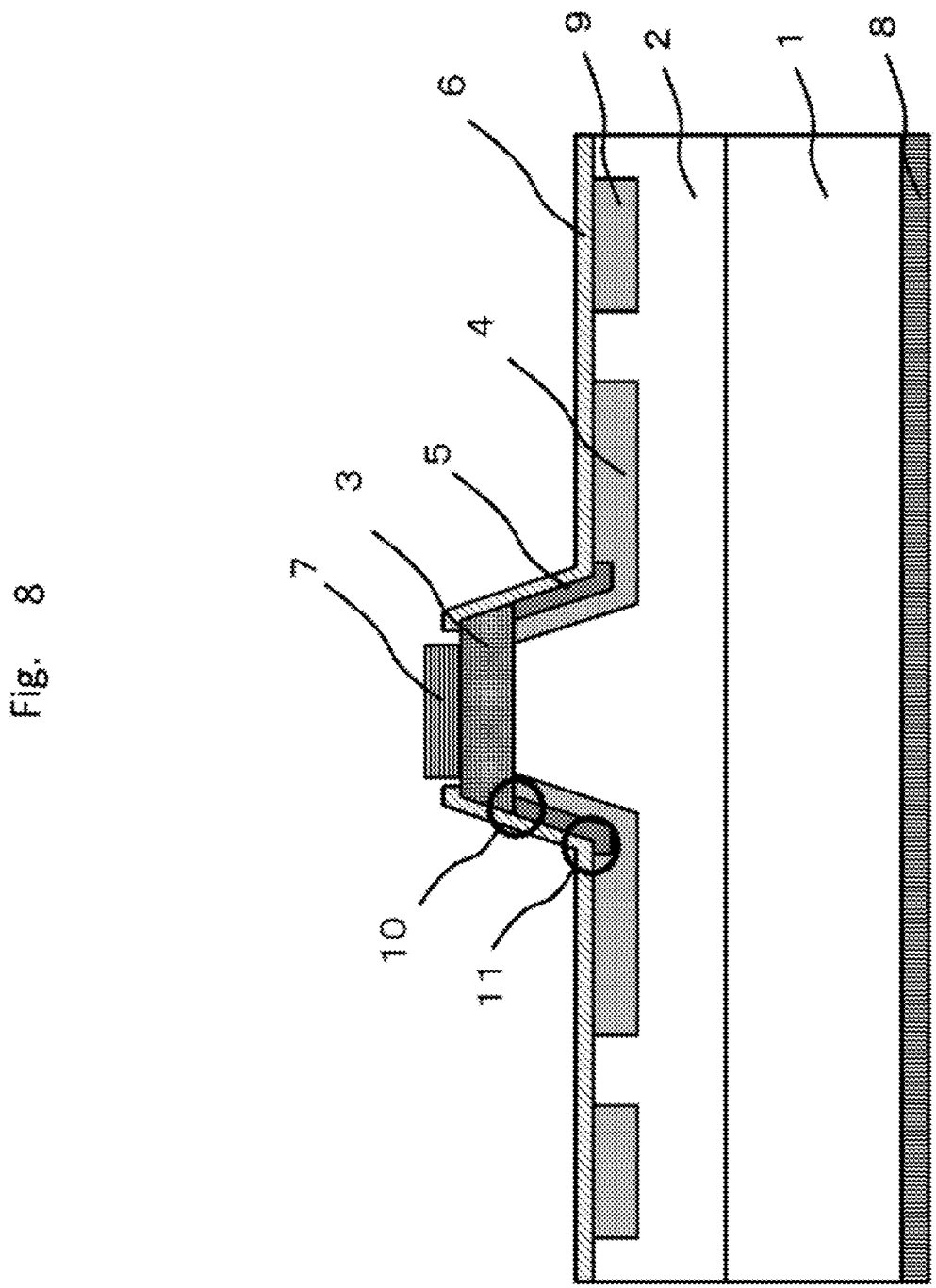
FIG. 8 is a schematic cross-sectional diagram showing high electric field portions of the p-n junction diode according to Embodiment 1 of the present invention.

When the SiC p-n junction diode is in the non-conductive state (off-state), a voltage is applied from the anode layer 3 to the outer peripheral edge of the mesa bottom portion. Within the portions described above, portions in particular where a strong electric field is generated are an anode edge 10 and a mesa end 11 shown in FIG. 8. In the present embodiment, the electric field is suppressed by providing the lightly doped region 4 and the highly doped region 5, etc.

It has to be noted here that the electric field strength at the anode edge 10 and the mesa end 11 changes in accordance with the angle formed between the mesa side wall and the mesa bottom portion. In a case where the mesa side wall is not oblique but vertical to the mesa bottom portion and the top face of the anode layer 3, the equipotential lines are sharply curved to be densely concentrated at the mesa end 11, so that the electric field becomes particularly stronger. In a case where the mesa side wall has a small angle with respect to the mesa bottom portion and the top face of the anode layer 3, the drift layer 2 and the anode layer 3 are cut off in such an angle with which the width of the drift layer 2 becomes relatively larger than that of the anode layer 3, and thus lines of the electric force are curved toward the side of the anode layer 3 to be densely concentrated at the anode end 10, so that the electric field becomes stronger. In the present embodiment, because the mesa side wall is oblique to the mesa bottom portion and the top face of the anode layer 3 by an angle ranging from 10 to 80 degrees, the curve of the equipotential lines around the anode edge 10 and the mesa end 11 turns to be gentle. As a result, the electric field at the anode edge 10 and the mesa end 11 is suppressed.

The inclination angle of the mesa side wall exceeding 80 degrees leads to a steep angle at the mesa end 11, and thus the electric field is concentrated at the mesa end 11.

To the contrary, the inclination angle of the mesa side wall being smaller than 10 degrees leads to a larger electric field strength at the anode edge 10. Further, in the case where the inclination angle of the mesa side wall is smaller than 10 degrees, as long as the lateral structure in the cross-section is the same, the height of the mesa structure and the distance between the anode layer 3 and the mesa end 11 are decreased, thereby leading to a larger electric field strength at the mesa end 11. As a result, the breakdown voltage of the SiC p-n junction diode is decreased. An increase in the height of the mesa structure and in the lateral structure length of the cross-section leads to an increase in the chip area of the silicon carbide semiconductor device.

Also, in a case where only the lightly doped region 4 is formed and the highly doped region 5 is not formed, which is not the case in the present embodiment, when high speed switching of the SiC p-n junction diode is performed, the electric field concentrated at the anode edge 10 and the mesa end 11 leads to the decrease in the breakdown voltage in some cases. The reason will be described below.

In the off-state of the SiC p-n junction diode, namely, in the static state in which a constant voltage is applied thereto, because the voltage is kept by the depletion layer formed by providing the lightly doped region 4, a high electric field is not applied to the anode edge 10 and the mesa end 11. However, in a switching state at which the SiC p-n junction diode is switched from the on-state to the off-state at high speed, the sweeping-out of electric charges from the depletion-layer region is delayed in some cases. Especially in a silicon carbide semiconductor device, because the ionization energy of a P-type acceptor, which is 180 meV or higher for aluminum (Al) and 300 meV or higher for boron (B), is several times larger than that of silicon, it takes very long time to release carriers from a P-type acceptor level.

Further, in a silicon carbide semiconductor, because there exists a number of deeper levels in which ionization energy thereof is larger than that, of boron (B), and they capture electric charges, so that the sweeping-out of electric charges from the depletion-layer region is significantly delayed. In a case where the sweeping-out of electric charges from the depletion-layer region is not enough faster than the switching speed, the depletion-layer region to which a high electric field is applied turns to be larger than in the static state. Therefore, in a case in which the highly doped region 5 is not formed, which is not the case in the present embodiment, the depletion-layer edge reaches the anode edge 10 and the mesa end 11 during high speed switching operation, so that the electric field is concentrated at the anode edge 10 and the mesa end 11.

In contrast, in a case where the highly doped region 5 is formed at the anode edge 10 and the mesa end 11 as shown in the present embodiment, the depletion layer expanding from a p-n junction interface between the lightly doped region 4 and the drift layer 2 during the high speed switching operation is stopped at the highly doped region 5, so that the concentration of the electric field at the anode edge 10 and the mesa end 11 can be avoided. Further, in the static state, the lightly doped region 4 which is properly designed for electric field relaxation in the static state prevents the electric field concentration from occurring. In this way, according to the present embodiment, the silicon carbide semiconductor device which can achieve a high breakdown voltage both during the high speed switching operation and in the static state can be provided.

In a case where the impurity concentration of the highly doped region 5 is sufficiently high, the electric field concentration at the anode edge 10 and the mesa end 11 during the high speed switching operation can be completely prevented. In a case where a frequency band used for the silicon carbide semiconductor device is known, the breakdown voltage during the high speed switching operation can be further improved by lowering the impurity concentration of the highly doped region 5 to a level at which the depletion layer edge does not reach the anode edge 10 and the mesa end 11 during the switching operation at the maximum frequency.

For example, when dV/dt during the high speed switching operation is within or higher than a range from 1 to 10 kV/μs, in some case, the carriers captured at a deep level cannot follow the switching speed and only a small number of them can be swept out. Therefore, it is preferable that the impurity concentration of the highly doped region 5 is set higher than the impurity concentration of the lightly doped region 4 by a degree of density at the deep level. Although depending on the manufacturing condition of the silicon carbide semiconductor device, the density of the deep level existing in the silicon carbide semiconductor device is, for example, about 50% of the impurity concentration in some case. Therefore, in this case, considering even the variation of the concentration in the manufacturing process, the impurity concentration of the highly doped region 5 is preferably twice or more than twice the impurity concentration of the lightly doped region 4. Further, in a case where dV/dt during the high speed switching operation is within or higher than a range from 10 to 100 kV/μs, even among the carriers captured by Al acceptors, the number of those which cannot follow the high speed switching increases. Therefore, the impurity concentration of the highly doped region 5 is preferably set higher than the impurity concentration of the lightly doped region 4 by one or more orders of magnitude. The value dV/dt used above in the separated cases is just an example and may be changed in accordance with the structure of the silicon carbide semiconductor device and the design of the breakout voltage thereof.

Figure 9:
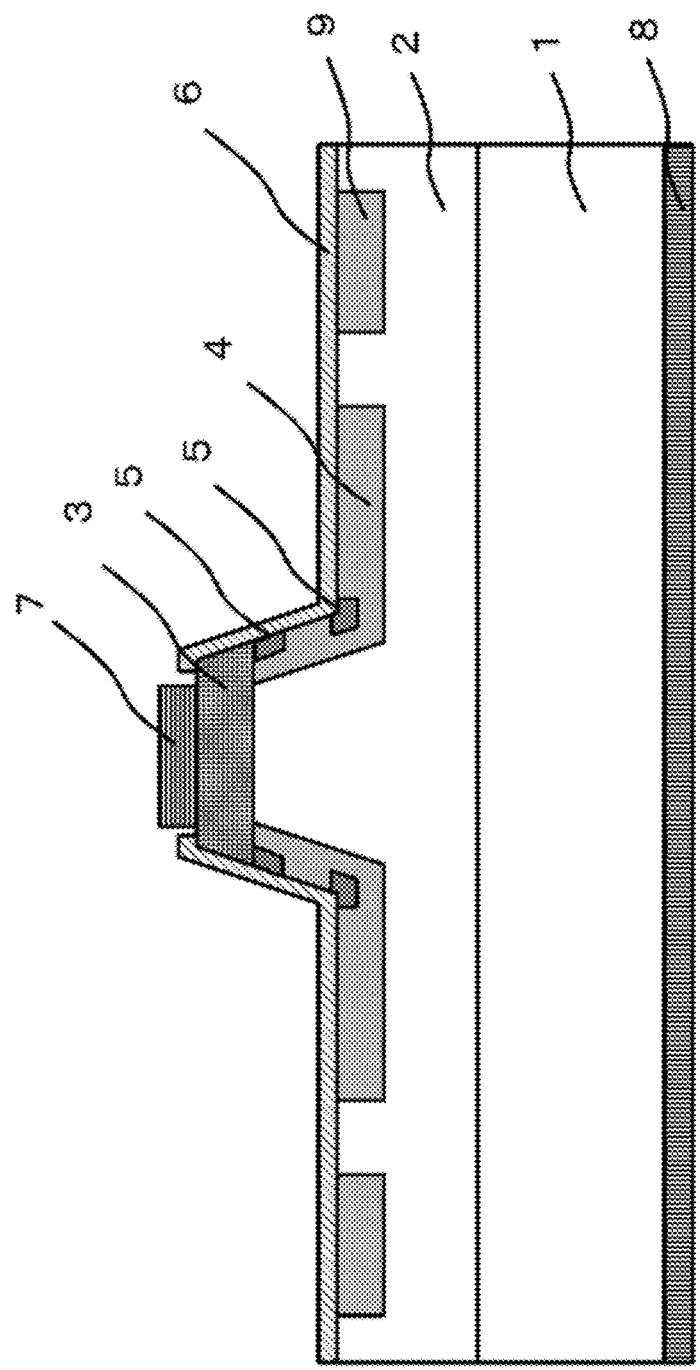
FIG. 9 is a schematic cross-sectional diagram showing another example of the p-n junction diode according to Embodiment 1 of the present invention.
Figure 10:
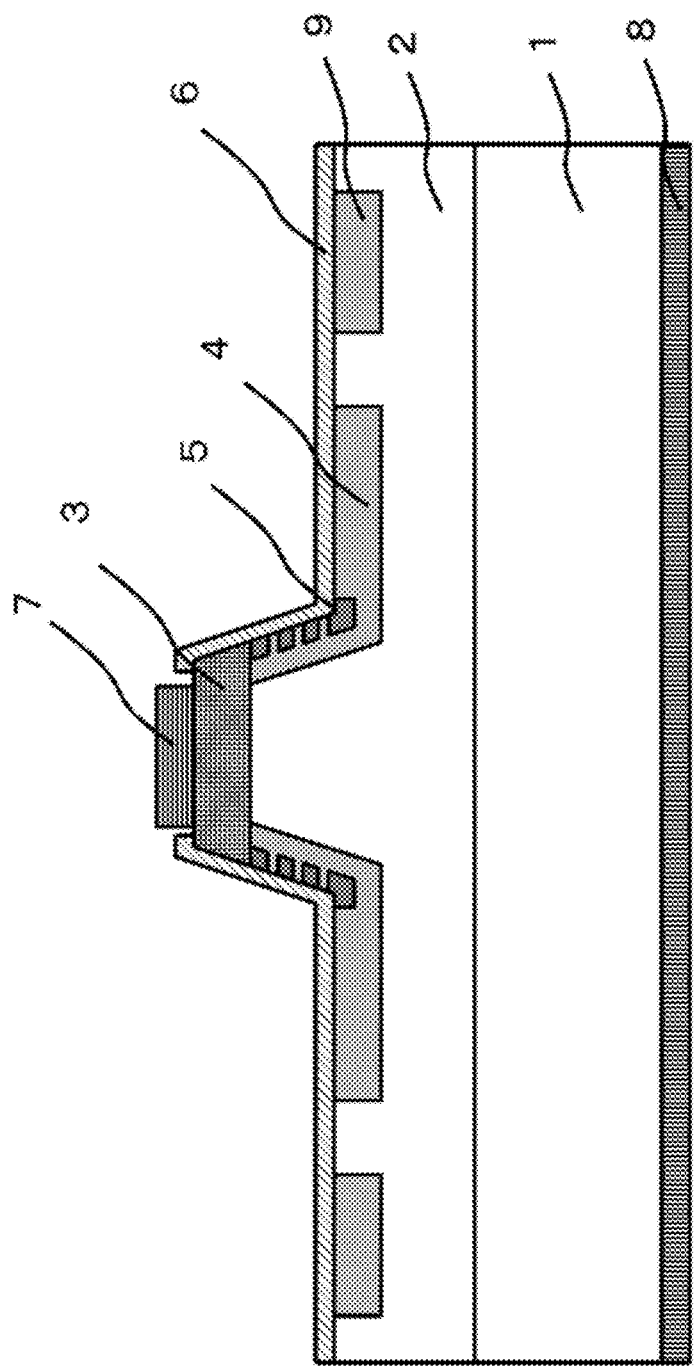
FIG. 10 is a schematic cross-sectional diagram showing another example of the p-n junction diode according to Embodiment 1 of the present invention.

The highly doped region 5 as shown in FIG. 1 does not need to be continuously extended from the anode edge 10 to the mesa end 11. As shown in the schematic cross-sectional diagram of FIG. 9, it may be arranged at the anode edge 10 and the mesa end 11 in a separated manner. As the highly doped region 5, it is sufficient that, in the lightly doped region 4, a portion being in contact with the edge of the anode layer 3 on the side of the mesa side wall and a portion connecting to the mesa bottom portion at the lower part of the mesa side wall are at least, highly concentrated. Further, as shown in the schematic cross-sectional diagram in FIG. 10, the highly doped region 5 may be separately disposed with a gap to each other in some portions from the anode edge 10 to the mesa end 11. The highly doped region 5 can be disposed by properly designing the impurity concentration, the total length, the implantation region width, the gap width, and the number of gaps in accordance with the breakdown voltage and the operating frequency.

Note that, although the impurity concentration throughout the highly doped region 5 is uniform in the present embodiment, the impurity concentration does not need to be uniform in the whole region. For example, the concentration may be gradually lowered from the side of the anode layer 3 toward an outer periphery. Also, the impurity concentration of the lightly doped region 4 does not need to be uniform in the whole region. For example, the concentration may be gradually lowered from the anode edge 10 toward the outer periphery.

The outer lightly doped region 9 may be omitted, or a plurality thereof may be provided. A gap between the lightly doped region 4 and the outer lightly doped region 9 can be set properly in accordance with the required breakdown voltage. The gap structure between the lightly doped region 4 and the outer lightly doped region 9 may be extended up to the mesa side-wall portion. As for the lightly doped region 4, the number of the plurality of outer lightly doped regions 9, and their gap widths, it is preferable that, in accordance with higher designed breakdown voltage, the total length of the lightly doped regions 4 and 9 should be longer and the number of gaps should be increased so as for the electric field to be uniformly distributed.

In the manufacturing method shown in the present embodiment, an example is shown in which the implantation for the highly doped region 5 is performed after the implantation for the lightly doped region 4. However, the order of the implantation may be changed. In an ion implantation process, for example, ions may be vertically implanted to the top face, or may be obliquely implanted by rotating the silicon carbide semiconductor device in process. Further, by using two or more masks for the implantation, implanted ion distribution on the mesa bottom portion and the mesa side wall can be precisely controlled.

Furthermore, in the manufacturing method shown in the present embodiment, an example is shown in which the cathode electrode 8 is formed before the anode electrode 7 is formed. The cathode electrode 8 may, however, be formed after all of the top-face-side steps such as the formation of the anode electrode 7.

In addition, in the manufacturing method shown in the present embodiment, although a method is described in which the mesa structure with an oblique shape is formed by the etching using the etching mask having an oblique portion formed, without forming the oblique portion in the silicon oxide film as the mask, the mesa structure with an oblique shape may be formed by adjusting etching conditions such as a type of gas, pressure, and power in RIE. Furthermore, in the silicon carbide, nitrogen (N) or phosphorus (P) can be used for N-type impurities and aluminum (Al) or boron (B) can be used for P-type impurities.

Embodiment 2

In the description of the silicon carbide semiconductor device according to Embodiment 1 described above, some examples are shown in which the inclination angle of the mesa side wall, the inclination angle of the interface (hereinafter, referred to as high-frequency interface) between the lightly doped region 4 and the highly doped region 5 in the mesa portion, and the inclination angle of the interface (hereinafter, referred to as low-frequency interface) between the lightly doped region 4 and the drift layer 2 of the mesa portion are substantially equal. In the present embodiment, a silicon carbide semiconductor device in which the inclination angle of the mesa side wall, the inclination angle of the high-frequency interface, and the inclination angle of the low-frequency interface are different will be described. The other configurations are the same as in Embodiment 1 and the detailed description will be omitted.

Figure 11:
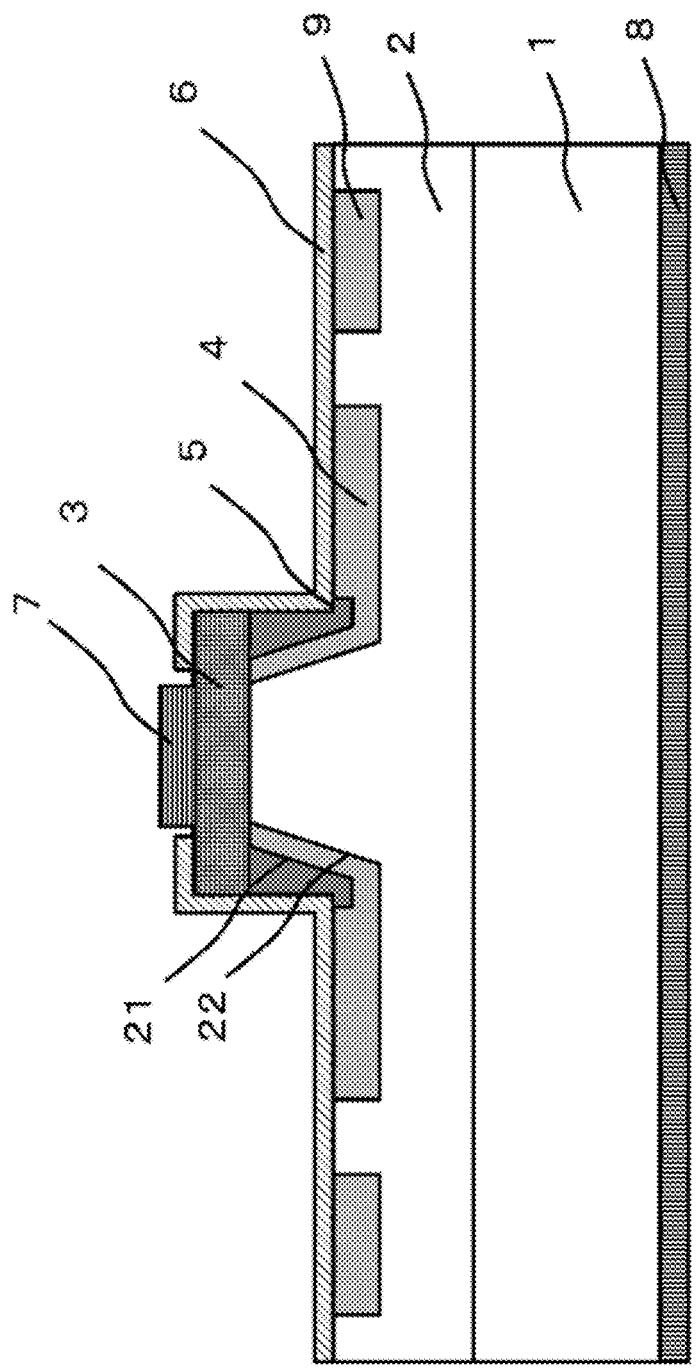
FIG. 11 is a schematic cross-sectional diagram of a p-n junction diode according to Embodiment 2 of the present invention.

FIG. 11 is a schematic cross-sectional diagram of an SiC p-n junction diode which is the silicon carbide semiconductor device according to the present embodiment of the present invention. In FIG. 11 the mesa portion is vertically formed with respect to the top face of the anode layer 3. In contrast, the high-frequency interface and the low-frequency interface of the SiC p-n junction diode according to Embodiment 2 are obliquely formed with respect to the top face of the anode layer 3 in the mesa portion, and their angles with respect to the top face of the anode layer 3 range from 10 to 80 degrees.

Figure 12:
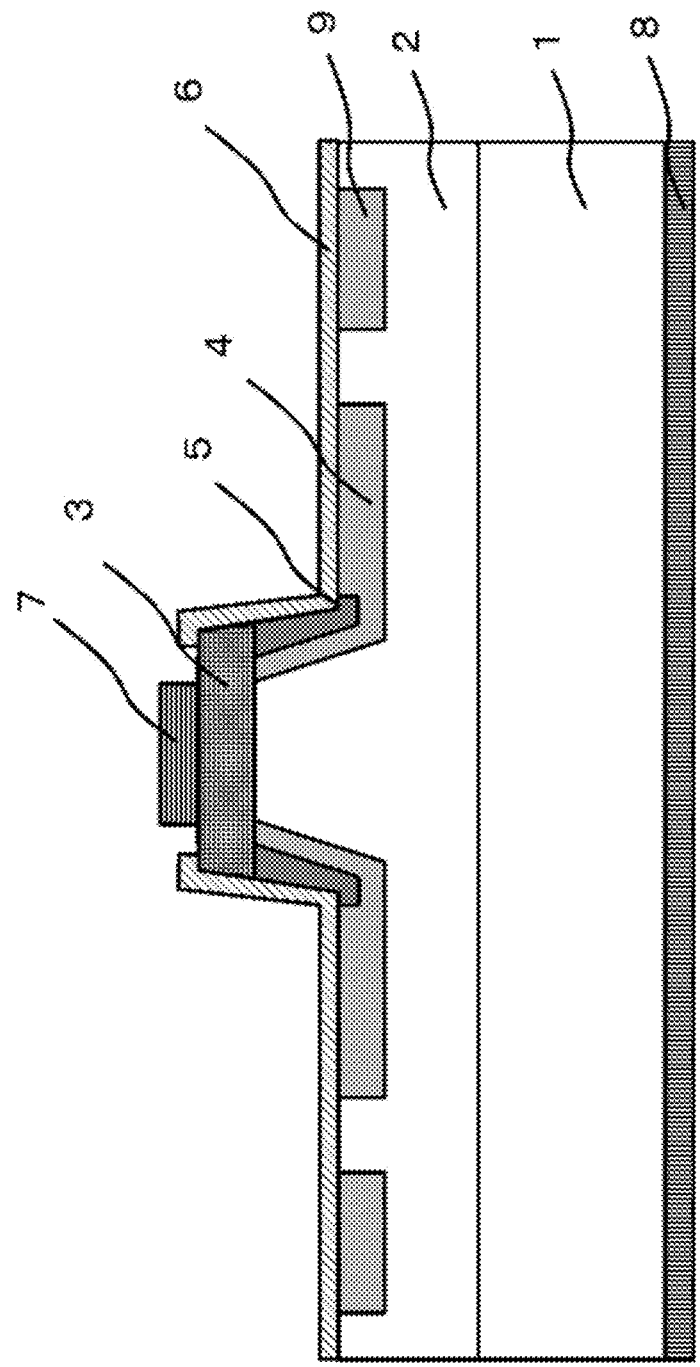
FIG. 12 is a schematic cross-sectional diagram of another example of the p-n junction diode according to Embodiment 2 of the present invention.

FIG. 12 is a schematic cross-sectional diagram of an SiC p-n junction diode of a different type of the silicon carbide semiconductor device according to the embodiment of the present invention. In FIG. 12, the mesa side wall is obliquely formed with respect to the top face of the anode layer 3, but the angle formed between the lightly doped region 4 and the top face of the anode layer 3 and the angle formed between the mesa side wall and the top face of the anode layer 3 are different.

Next, in the manufacturing method of the SiC p-n junction diode according to the present embodiment, the points different from the manufacturing method of the SiC p-n junction diode according to Embodiment 1 will be described. In the present embodiment, the lightly doped region 4 is formed by ion-implantation before the mesa structure is formed, and then the mesa structure is formed by etching or the like. As for the ion implantation of the lightly doped region 4, a method can be applied, for example, in which the ion implantation is performed to the device surface from an oblique direction while rotating a wafer substrate in the concerned process state including the silicon carbide semiconductor substrate 1. For more precise control for the distribution of the ion-implantation, the ion implantation process may be performed multiple times, and/or multiple masks may be used. Further, the interface angle between the lightly doped region 4 and the drift layer 2 can be adjusted by adjusting the ion implantation direction. The same may be performed to the highly doped region 5 at this step. In addition to the above, by performing etching such as RIE using a resist mask of a predetermined shape after forming the lightly doped region 4, the mesa side wall can be vertically or obliquely formed at any angle with respect to the top face of the anode layer.

The high-frequency interface almost coincides with the depletion-layer edge during the switching operation and the low-frequency interface almost coincides with the depletion-layer edge in the static state. On the same ground regarding the inclination angle of the mesa side wall described in Embodiment 1, an inclination angle of the depletion layer in the mesa portion, which greatly affects the distribution of the electric field applied to the mesa portion and the breakdown voltage of the silicon carbide semiconductor device, can be designed in accordance with the specifications such as designed breakdown voltage of the silicon carbide semiconductor device. When compared to determining the mesa inclination angle by etching as described in Embodiment 1, by determining the inclination angle of the high-frequency interface 21 and the low-frequency interface 22 as described in the present embodiment, the inclination angle of the depletion layer can be freely adjusted so that the breakdown voltage of the silicon carbide semiconductor device can be further improved.

Note that, in the above embodiments, in a case where the impurity concentration in each region has a concentration profile, "the impurity concentration [$cm^{-3}$]" in each region indicates a peak value of the impurity concentration in each region and, also, "the thickness" of each region is defined as a thickness of the area where the impurity concentration value is one tenth of the peak value of the impurity concentration or higher.

Also note that, in the above embodiments, the first conductivity-type is described as N-type and the second conductivity-type is described as P-type, but this may be reversed. Further, as long as a silicon carbide semiconductor device has a p-n junction at the mesa portion, the present invention is also effective to silicon carbide semiconductor devices such as a Schottky barrier diode (SBD), a junction barrier Schottky diode (JBS), a field effect transistor (FET), and a bipolar junction transistor (BJT). Further, for convenience, in describing an example of the p-n junction diode, in the regions forming the p-n junction, the P-type region is referred to an anode layer and the N-type region is referred to a drift layer. The reference for each region, however, may be changed if needed.

DESCRIPTION OF SYMBOLS

1: silicon carbide semiconductor substrate
2: drift layer
3: anode layer
4: lightly doped region
5: highly doped region
6: insulating layer
7: anode electrode
8: cathode electrode
9: outer lightly doped region

The invention claimed is:
1. A silicon carbide semiconductor device comprising:
a first conductivity-type silicon carbide semiconductor substrate;

a first conductivity-type drift layer formed on the silicon carbide semiconductor substrate;

a second conductivity-type anode layer formed on the drift layer;

a mesa structure having a flat mesa bottom portion formed in an outer periphery thereof and having a mesa side wall obliquely formed with respect to a top face of the anode layer in a cross section ranging from the anode layer to the drift layer;

a second conductivity-type lightly doped region formed from an edge of the anode layer to the mesa bottom portion so as to include the mesa side wall and formed so as for a cross section of an interface thereof with the drift layer to be oblique to the top face of the anode layer; and a second conductivity-type highly doped region in contact with the anode layer and formed in a portion on a side of the mesa side wall in the lightly doped region in contact with the edge of the anode layer and in a portion connected to the mesa bottom portion at a lower part of the mesa side wall, wherein a second conductive-type impurity concentration of the highly doped region is higher than that of the lightly doped region.

2. The silicon carbide semiconductor device according to claim 1, wherein dV/dt during switching operation is 1 kV/µs or higher.

3. The silicon carbide semiconductor device according to claim 2, wherein the second conductive-type impurity concentration of the highly doped region is twice or more than twice the second conductive-type impurity concentration of the lightly doped region.

4. The silicon carbide semiconductor device according to claim 2, wherein dV/dt during switching operation is 10 kV/µs or higher.

5. The silicon carbide semiconductor device according to claim 4, wherein the second conductive-type impurity concentration of the highly doped region is higher than the second conductive-type impurity concentration of the lightly doped region by one or more orders of magnitude.

6. The silicon carbide semiconductor device according to claim 1, wherein the second conductive-type impurity in the anode layer, the lightly doped region, and the highly doped region is aluminum or boron.

7. The silicon carbide semiconductor device according to claim 2, wherein the second conductive-type impurity in the anode layer, the lightly doped region, and the highly doped region is aluminum or boron.

8. The silicon carbide semiconductor device according to claim 3, wherein the second conductive-type impurity in the anode layer, the lightly doped region, and the highly doped region is aluminum or boron.

9. The silicon carbide semiconductor device according to claim 4, wherein the second conductive-type impurity in the anode layer, the lightly doped region, and the highly doped region is aluminum or boron.

10. The silicon carbide semiconductor device according to claim 5, wherein the second conductive-type impurity in the anode layer, the lightly doped region, and the highly doped region is aluminum or boron.

11. The silicon carbide semiconductor device according to claim 1, wherein an angle of the mesa side wall with respect to the top face of the anode layer is from 10 degrees to 80 degrees.

12. The silicon carbide semiconductor device according to claim 2, wherein an angle of the mesa side wall with respect to the top face of the anode layer is from 10 degrees to 80 degrees.

13. The silicon carbide semiconductor device according to claim 3, wherein an angle of the mesa side wall with respect to the top face of the anode layer is from 10 degrees to 80 degrees.

14. The silicon carbide semiconductor device according to claim 4, wherein an angle of the mesa side wall with respect to the top face of the anode layer is from 10 degrees to 80 degrees.

15. The silicon carbide semiconductor device according to claim 11, wherein an angle of the interface between the drift layer and the lightly doped region with respect to the top face of the anode layer is from 10 degrees to 80 degrees.

16. The silicon carbide semiconductor device according to claim 1, wherein the impurity concentration of the highly doped region is lower than an impurity concentration of the anode layer.

17. The silicon carbide semiconductor device according to claim 1, wherein the highly doped region formed in the portion on the side of the mesa side wall in the lightly doped region in contact with the edge of the anode layer and in the portion connected to the mesa bottom portion at the lower part of the mesa side wall is continuous.

18. The silicon carbide semiconductor device according to claim 1, wherein the highly doped region formed in the portion on the side of the mesa side wall in the lightly doped region in contact with the edge of the anode layer and in the portion connected to the mesa bottom portion at the lower part of the mesa side wall is separated.

19. The silicon carbide semiconductor device according to claim 1, wherein an angle of the mesa side wall with respect to the top face of the anode layer and an angle of the interface between the drift layer and the lightly doped region with respect to the top face of the anode layer are different.

20. A silicon carbide semiconductor device comprising:
a first conductivity-type silicon carbide semiconductor substrate;
a first conductivity-type drift layer formed on the silicon carbide semiconductor substrate;
a second conductivity-type anode layer formed on the drift layer;
a mesa structure having a flat mesa bottom portion formed in an outer periphery thereof and having a mesa side wall vertically formed with respect to a top face of the anode layer in a cross section ranging from the anode layer to the drift layer;
a second conductivity-type lightly doped region formed from an edge of the anode layer to the mesa bottom portion so as to include the mesa side wall and formed so as form a cross section of an interface thereof with the drift layer to be oblique to the top face of the anode layer; and
a second conductivity-type highly doped region formed in a portion on a side of the mesa side wall in the lightly doped region in contact with the edge of the anode layer and in a portion connected to the mesa bottom portion at a lower part of the mesa side wall, wherein a second conductive-type impurity concentration of the highly doped region is higher than that of the lightly doped region.

* * * * *